United States Patent
Chung et al.

(10) Patent No.: US 10,553,613 B2
(45) Date of Patent: Feb. 4, 2020

(54) SUBSTRATE FOR CURVED DISPLAY PANEL, CURVED DISPLAY PANEL, AND CURVED DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Jae Moon Chung, Beijing (CN); Hongwei Du, Beijing (CN)

(73) Assignees: BOE TECHNOLOGY GROUP CO., LTD., Beijing (CN); CHONGQING BOE OPTOELECTRONICS TECHNOLOGY CO., LTD, Chongqing (CN)

( * ) Notice: Subject to any disclaimer, the term of this patent is extended or adjusted under 35 U.S.C. 154(b) by 0 days.

(21) Appl. No.: 15/778,038

(22) PCT Filed: Oct. 27, 2017

(86) PCT No.: PCT/CN2017/108052
§ 371 (c)(1),
(2) Date: May 22, 2018

(87) PCT Pub. No.: WO2018/166210
PCT Pub. Date: Sep. 20, 2018

(65) Prior Publication Data
US 2019/0043894 A1    Feb. 7, 2019

(30) Foreign Application Priority Data
Mar. 16, 2017    (CN) .......................... 2017 1 0156155

(51) Int. Cl.
*H01L 27/12* (2006.01)
*G02F 1/1362* (2006.01)
(Continued)

(52) U.S. Cl.
CPC ........ *H01L 27/1218* (2013.01); *G02F 1/1368* (2013.01); *G02F 1/133514* (2013.01);
(Continued)

(58) Field of Classification Search
CPC ............... H01L 27/1218; H01L 27/124; H01L 27/3272; H01L 51/5284; G02F 1/133512;
(Continued)

(56) References Cited

U.S. PATENT DOCUMENTS

2004/0229139 A1    11/2004    Tanaka et al.
2014/0211103 A1*   7/2014    Baek .................. G02F 1/133753
                                                                       349/12
(Continued)

FOREIGN PATENT DOCUMENTS

CN        1523380 A        8/2004
CN      104049399 A        9/2014
(Continued)

OTHER PUBLICATIONS

International Search Report from PCT Application No. PCT/CN2017/108052 dated Jan. 29, 2018 (4 pages).
(Continued)

*Primary Examiner* — Matthew E Warren
(74) *Attorney, Agent, or Firm* — Dave Law Group LLC; Raj S. Dave

(57) ABSTRACT

Embodiments of the present disclosure relate to a substrate for a curved display panel, the curved display panel, and a curved display device. A substrate for a curved display panel is provided. The curved display panel includes a plurality of opening areas arranged in an array. The substrate includes a first base substrate which is curved; a strip-shaped black matrix positioned on the first base substrate and extending along a direction approximately parallel to a curved edge of the first base substrate; and a blocking portion positioned on
(Continued)

the first base substrate. An orthographic projection of the blocking portion on the first base substrate is within an orthographic projection region of the opening area on the first base substrate.

12 Claims, 4 Drawing Sheets

(51) Int. Cl.
G02F 1/1335 (2006.01)
G02F 1/1368 (2006.01)

(52) U.S. Cl.
CPC .. *G02F 1/136209* (2013.01); *G02F 1/136286* (2013.01); *H01L 27/124* (2013.01); *G02F 1/136227* (2013.01); *G02F 2001/136222* (2013.01); *G02F 2201/52* (2013.01); *G02F 2201/56* (2013.01)

(58) Field of Classification Search
CPC ......... G02F 1/133514; G02F 1/136209; G02F 1/136222
See application file for complete search history.

(56) References Cited

U.S. PATENT DOCUMENTS

| | | | |
|---|---|---|---|
| 2016/0195761 A1* | 7/2016 | Liu | G02F 1/133514 257/88 |
| 2017/0285392 A1* | 10/2017 | Hirata | G02F 1/133308 |
| 2018/0061862 A1* | 3/2018 | Chen | G02F 1/1362 |
| 2018/0196296 A1 | 7/2018 | Li et al. | |
| 2018/0210277 A1* | 7/2018 | Wang | H01L 51/0097 |

FOREIGN PATENT DOCUMENTS

| | | |
|---|---|---|
| CN | 105974679 A | 9/2016 |
| CN | 106019725 A | 10/2016 |
| JP | 2004126197 A | 4/2004 |
| TW | 201039027 A | 11/2010 |

OTHER PUBLICATIONS

Written Opinion from PCT Application No. PCT/CN2017/108052 dated Jan. 29, 2018 (3 pages).

* cited by examiner

SUBSTRATE FOR CURVED DISPLAY PANEL, CURVED DISPLAY PANEL, AND CURVED DISPLAY DEVICE

CROSS-REFERENCE TO RELATED APPLICATION

This application claims the benefit and priority of Chinese Patent Application No. 201710156155.8 filed on Mar. 16, 2017, the entire content of which is incorporated herein by reference as a part of the present application.

FIELD

Embodiments of the present disclosure relate to the field of liquid crystal display technologies, and more particularly, to a substrate for a curved display panel, the curved display panel, and a curved display device.

BACKGROUND

A thin film transistor liquid crystal display (TFT-LCD) is one of widely used display equipment at present. The structure of the TFT-LCD is that a liquid crystal cell is arranged between two parallel base substrates. For example, a color filter, a black matrix and a common electrode or the like are arranged on the first base substrate, a thin film transistor (TFT) and a pixel electrode are arranged on the second base substrate. Deflecting directions of liquid crystal molecules are controlled by changing the signal and voltage of the TFT, such that emission of polarized light corresponding to each pixel is controlled, to achieve the display objective.

SUMMARY

An aspect of the present disclosure provides a substrate for a curved display panel. The curved display panel includes a plurality of opening areas arranged in an array. The substrate includes a first base substrate which is curved; a strip-shaped black matrix positioned on the first base substrate and extending along a direction substantially parallel to a curved edge of the first base substrate; and a blocking portion positioned on the first base substrate. An orthographic projection of the blocking portion on the first base substrate is within an orthographic projection region of the opening area on the first base substrate.

In an embodiment, the blocking portion directly contacts with the strip-shaped black matrix.

In an embodiment, the blocking portion includes a protrusion positioned on a side of the strip-shaped black matrix along an extension direction of the strip-shaped black matrix.

In an embodiment, the blocking portion includes a recess positioned on a side, of the strip-shaped black matrix, along an extension direction of the strip-shaped black matrix.

In an embodiment, the blocking portion includes a connection part connecting two adjacent strip-shaped black matrices.

In an embodiment, the blocking portion includes an island positioned between adjacent strip-shaped black matrices and isolated from the strip-shaped black matrices.

In an embodiment, the blocking portion and the strip-shaped black matrix are formed by the same material.

In an embodiment, the opening areas include a red sub-pixel, a green sub-pixel, and a blue sub-pixel. The orthographic projection of the blocking portion on the first base substrate is within an orthographic projection region of at least one of the red sub-pixel, the green sub-pixel and the blue sub-pixel on the first base substrate.

In an embodiment, the orthographic projection of the blocking portion on the first base substrate is within the orthographic projection region of the red sub-pixel on the first base substrate.

Another aspect of the present disclosure provides a curved display panel, including an array substrate and any one of the substrates described herein. The substrate and the array substrate are arranged oppositely. The array substrate includes a second base substrate having a bending direction the same as that of the first base substrate; a thin film transistor positioned on the second base substrate; and a first signal line and a second signal line intersecting with each other and positioned on the second base substrate. An orthographic projection of one of the first signal line and the second signal line on the first base substrate is within an orthographic projection region of the strip-shaped black matrix on the first substrate.

In an embodiment, the array substrate further includes a color filter layer positioned on the thin film transistor and the second base substrate. A via to a source or a drain of the thin film transistor is formed in the color filter layer.

In an embodiment, the color filter layer includes a red filter region, a green filter region and a blue filter region. The orthographic projection of the blocking portion on the first base substrate is within an orthographic projection region of at least one of the red filter region, the green filter region and the blue filter region on the first base substrate.

In an embodiment, the orthographic projection of the blocking portion on the first base substrate is within the orthographic projection region of the red filter region on the first base substrate.

In an embodiment, the first signal line includes a gate signal line, and the second signal line includes a data signal line.

In an embodiment, an orthographic projection of the gate signal line on the first base substrate is within an orthographic projection region of the strip-shaped black matrix on the first base substrate.

Still another aspect of the present disclosure provides a display device, including any one of the curved display panels described herein.

BRIEF DESCRIPTION OF DRAWINGS

The drawings described herein are for illustrative purposes only of selected embodiments and not all possible implementations, and are not intended to limit the scope of the present application, in which.

Corresponding reference numerals indicate corresponding parts or features throughout the several views of the drawings.

DETAILED DESCRIPTION

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components will be omitted so as not to obscure the invention. Further, various embodiments encompass present and future known equivalents to the components referred to herein by way of illustration.

In the description of the present disclosure, the orientations or positions represented by the terms of "on", "above", "under", "below", "top", "bottom" and "between" and the like are based on the accompanying figures. They are merely for ease of a description of the present disclosure and a simplified description instead of being intended to indicate or imply the device or element to have a special orientation or to be configured and operated in a special orientation. Thus, they cannot be understood as limiting of the present disclosure. In addition, when an element or layer is referred to as being "on" another element or layer, it may be directly on the other element or layer, or intervening elements or layers may be present. Likewise, when an element or layer is referred to as being "under" another element or layer, it may be directly under the other element or layer, or at least one intervening element or layer may be present. When an element or layer is referred to as being "between" two elements or two layers, it may be unique element or layer between the two elements or two layers, or at least one intervening element or layer may be present.

In addition, when an element and an embodiment thereof in this application are introduced, articles "a" "an", "said" and "the" may be intended to indicate one or more elements are present. Unless otherwise stated, "a plurality of" means two or more than two. The terms "comprise", "include", "contain" and "have" are inclusive and therefore specify the presence of other elements excluding the elements listed out. The terms "first", "second", "third" and so on are merely for description purposes, and are not construed as indicating or implying relative importance and formation order.

Figure 1:
FIG. 1 illustrates a schematic diagram of arrangement of a black matrix of a curved display device.

In a liquid crystal display device, black matrices (BM) may be arranged on a substrate (also referred to as a counter substrate in other places herein) arranged opposite to the array substrate and may be arranged in the row direction and the column direction respectively, to space different rows of pixels and different columns of pixels so as to prevent color mixture and to shelter a signal line or an electronic device on the array substrate. However, in the curved display device based on COA (Color filter On Array), the counter substrate and the array substrate are curved around, for example, the column direction. In such a case, the black matrices in the row direction are curved together with the counter substrate, whereas the black matrices in the column may produce deformation and/or offset with different degrees due to curving of the counter substrate. For example, a part of the black matrices offset leftward to the left-sided pixels, whereas another part of the black matrices offset rightward to the right-sided pixels. Thus, problems such as color mixture, color cast and light leak are caused. To avoid the problems such as color mixture, color cast and light leak caused by deformation and/or offset of the black matrices, during the curved display device is fabricated, for example, the black matrices may be not formed in the column direction, instead signal lines arranged on the array substrate and extending along the column direction are employed to space the different columns of pixels. FIG. 1 illustrates a schematic diagram of arrangement of a black matrix of a curved display device. In FIG. 1, the black matrix 101 is arranged in a row direction. That is, the black matrix 101 extends along the row direction, and no black matrix is arranged in a column direction.

Figure 2:
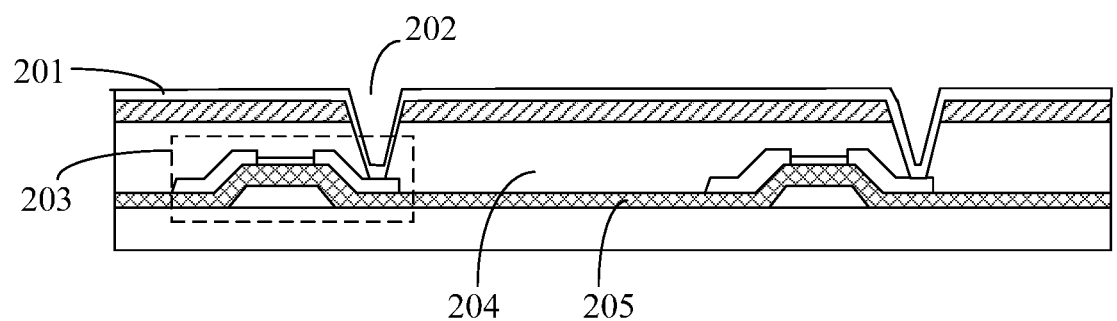
FIG. 2 illustrates a schematic cross-sectional view of an array substrate in COA technologies.

In the COA technologies, after a thin film transistor is fabricated on the array substrate, a color filter layer is directly fabricated, and then other film layers such as an insulating layer and a pixel electrode are fabricated above the color filter layer. FIG. 2 illustrates a schematic cross-sectional view of an array substrate based on the COA. In the configuration as shown in FIG. 2, to transmit a signal to a pixel electrode 201, a plurality of vias 202 need to be formed in the array substrate, such that the pixel electrode 201 may be electrically connected to a thin film transistor 203. Typically, the thickness of the color filter layer 204 is much larger than that of other film layers (for example, the pixel electrode 201, the insulating layer 205, and so on) on the array substrate. Therefore, in the case that the color filter layer is fabricated on the array substrate, the formed via 202 has a larger depth (compared with the color filter layer fabricated on the counter substrate). As thus, it is difficult to completely remove air from the vias during vacuum treatment. After the array substrate and the counter substrate are oppositely arranged to form a cell and the liquid crystal is filled into the cell, the air remaining in the vias forms small air bubbles entering into the liquid crystal layer. In the seal oven process for the display panel, these small air bubbles may move in the liquid crystal layer such that these small air bubbles may converge into large air bubbles. It is difficult to remove the large air bubbles from the liquid crystal layer during seal oven process, which has a serious adverse influence on the display effect of the display panel.

It is to be noted that the term "pixel" herein is a basic function unit used for displaying an image, which includes a functional region used for displaying and a non-functional region not used for displaying. The functional region may include a pixel electrode, a common electrode portion facing to the pixel electrode, a liquid crystal layer portion positioned between the pixel electrode and the corresponding common electrode portion, and a corresponding filter region (Red, Green and Blue). The non-functional region includes, for example, a thin film transistor, a data line, a gate line and a black matrix, etc. The term "pixel region" or "region where a pixel is located" represents a region occupied by the pixel. However, for convenience, in some places of the present disclosure, the "pixel", the "pixel region" and the "region where a pixel is located" may be not clearly distinguished. The opening area of the curved display panel herein corresponds to a functional region of a pixel.

An embodiment of the present disclosure provides a substrate for a curved display panel. A blocking portion is formed on a base substrate of the substrate. An orthographic projection of the blocking portion on the base substrate is within an orthographic projection region of the opening area of the curved display panel on the base substrate to prevent air bubbles from moving in the liquid crystal layer. Therefore, small air bubbles may be prevented from converging into large air bubbles. FIGS. 3a to 3d illustrate schematic plane views of a substrate for a curved display panel according to an embodiment of the present disclosure. As shown in FIGS. 3a to 3d, the substrate may include a first base substrate 301 which is curved; a strip-shaped black matrix 302 positioned on the first base substrate 301 and extending along a direction substantially parallel to a curved edge of the first base substrate 301; and a blocking portion 303 positioned on the first base substrate 301. An orthographic projection of the blocking portion 303 on the first base substrate 301 is within an orthographic projection region of the opening area 304 of the curved display panel on the first base substrate 301. As shown in FIGS. 3a to 3d, the opening area 304 may be schematically indicated as an area between two dashed lines. This area generally corresponds to an in-pixel region of the curved display panel. In the embodiment of the present disclosure, the blocking portion 303 may prevent air bubbles in the liquid crystal layer of the curved display panel from moving.

In an embodiment of the present disclosure, "the strip-shaped black matrix 302 extending along a direction substantially parallel to a curved edge of the first base substrate 301" may be interpreted as the strip-shaped black matrix 302 continuously extending along the direction substantially parallel to the curved edge of the first base substrate 301, and also may be interpreted as the strip-shaped black matrix having one or more interruptions during extending along the direction substantially parallel to the curved edge of the first base substrate 301.

In the embodiment described herein, the blocking portion 303 is formed on the substrate such that the blocking portion 303 may provide an obstacle in an extension direction (i.e., on a potential movement path of air bubbles, as shown by arrows in FIGS. 3a to 3d) of the strip-shaped black matrix 302, which may effectively prevent the air bubbles from moving in the liquid crystal layer, and thus effectively prevent small air bubbles from converging into large air bubbles due to the movement of small air bubbles in the seal oven process, thereby preventing from having an adverse influence on the display effect of the display panel. Furthermore, the blocking portion is formed within the area where the pixels are located instead of between adjacent pixel regions, which may avoid problems such as color mixture, color cast and light leak caused by curving of the substrate in the curved display panel.

In embodiments described herein, the pixel may include a red sub-pixel, a green sub-pixel, and a blue sub-pixel. An orthographic projection of the blocking portion 303 on the first base substrate 301 may be within the orthographic projection of at least one of the red sub-pixel, the green sub-pixel and the blue sub-pixel on the first base substrate. However, it is to be understood that in view of the aperture ratio of the display panel formed by using the substrate provided by the present disclosure and other factors, in an alternative embodiment, the orthographic projection of the blocking portion 303 on the first base substrate 301 may be merely within the orthographic projection region of one of the sub-pixels on the first base substrate 301. Through this configuration, on one hand, the movement of air bubbles in the liquid crystal layer may be blocked, and on the other hand, the aperture ratio of the product may be not significantly affected.

In an embodiment, in view of a fact that the red sub-pixel has a higher light transmissivity in the display panel, compared with the green sub-pixel and the blue sub-pixel the blocking portion 303 may be arranged such that the orthographic projection of the blocking portion 303 on the first base substrate 301 is within the orthographic projection region of the red sub-pixel on the first base substrate 301. That is, the blocking portion 303 may be arranged within the region, of the first base substrate, corresponding to the red sub-pixel. In this configuration, the potential impact of the blocking portion on the light transmissivity of the product may be reduced, and characteristics such as color gamut and color temperature of the product may be not apparently affected.

Figure 3A:
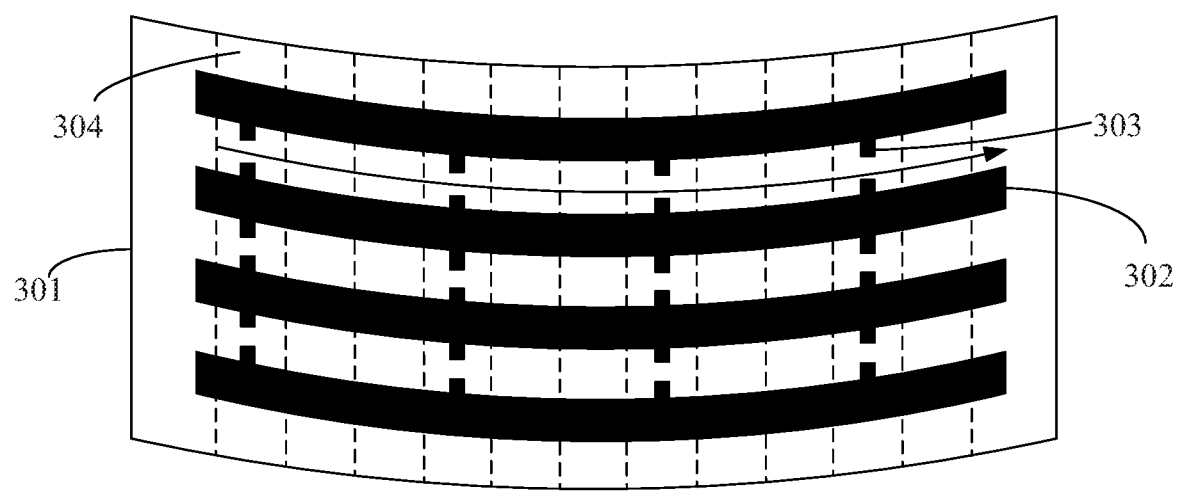
FIGS. 3a to 3d illustrate schematic plane views of a substrate for a curved display panel according to an embodiment of the present disclosure.
Figure 3B:
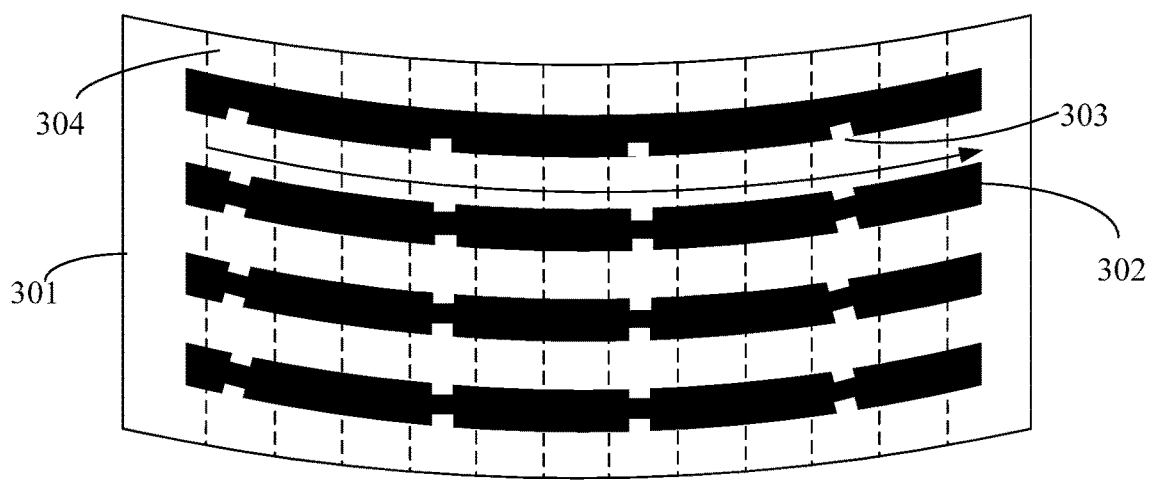
Figure 3C:
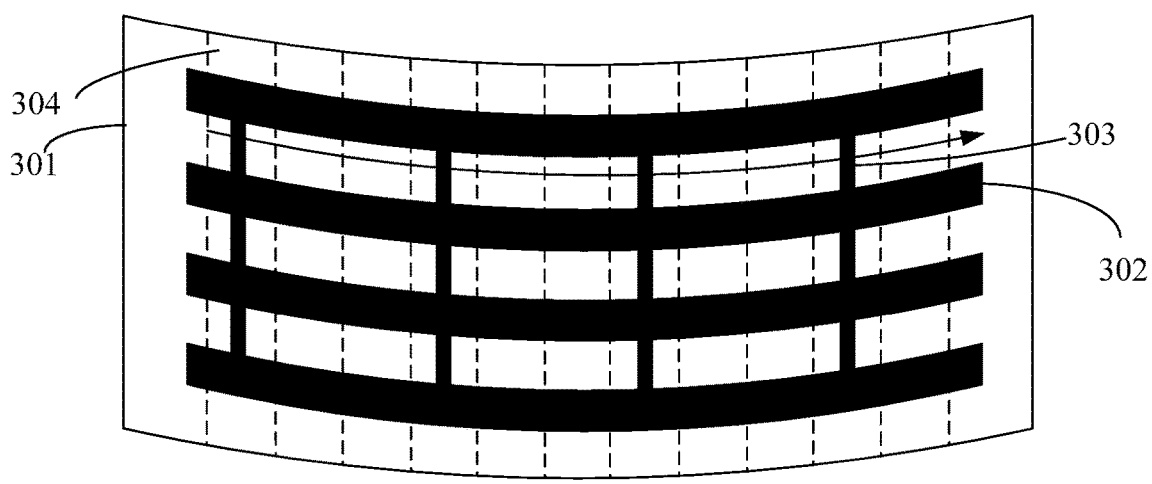
Figure 3D:
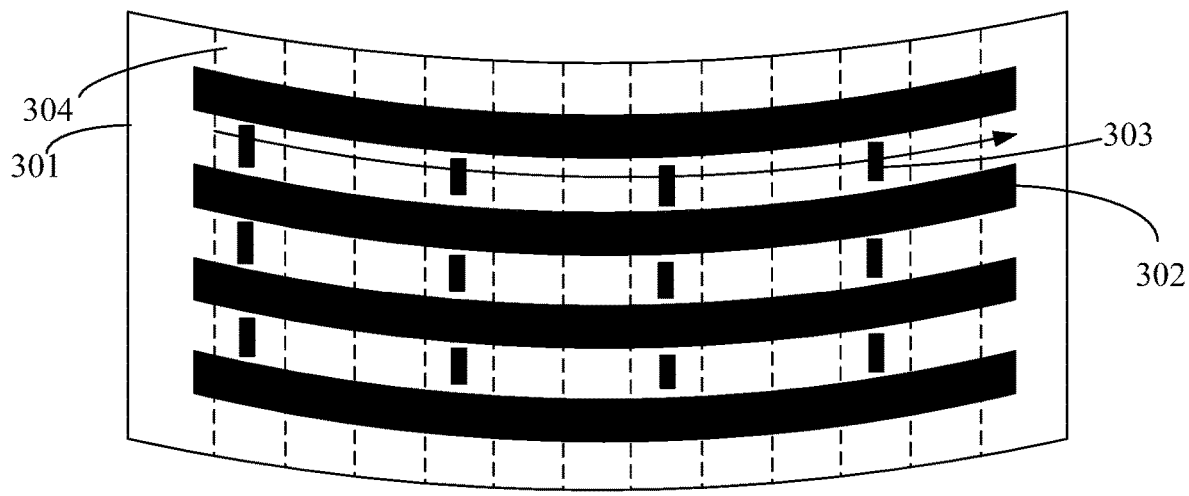

In an embodiment, the blocking portion and the strip-shaped black matrix may be formed by the same material. In this configuration, during the substrate is fabricated, the blocking portion and the strip-shaped black matrix may be formed integrally or contiguously. Thus, the fabrication process may be simplified. As shown in FIG. 3a, the blocking portion 303 may include a protrusion positioned on a side, of the strip-shaped black matrix 302, along an extension direction of the strip-shaped black matrix 302. As shown in FIG. 3b, the blocking portion 303 also may include a recess positioned on a side, of the strip-shaped black matrix 302, along an extension direction of the strip-shaped black matrix 302. As shown in FIG. 3c, the blocking portion 303 also may include a connection part connecting two adjacent strip-shaped black matrices 302. As shown in FIG. 3d, the blocking portion 303 also may include an island positioned between adjacent strip-shaped black matrices 302 and isolated from the strip-shaped black matrices 302. It is to be understood that in embodiments of the present disclosure, the blocking portion also may include a combination of a protrusion, a recess, and a connection part. Other embodiments about the position and shape of the blocking portion also may be feasible.

Figure 4:
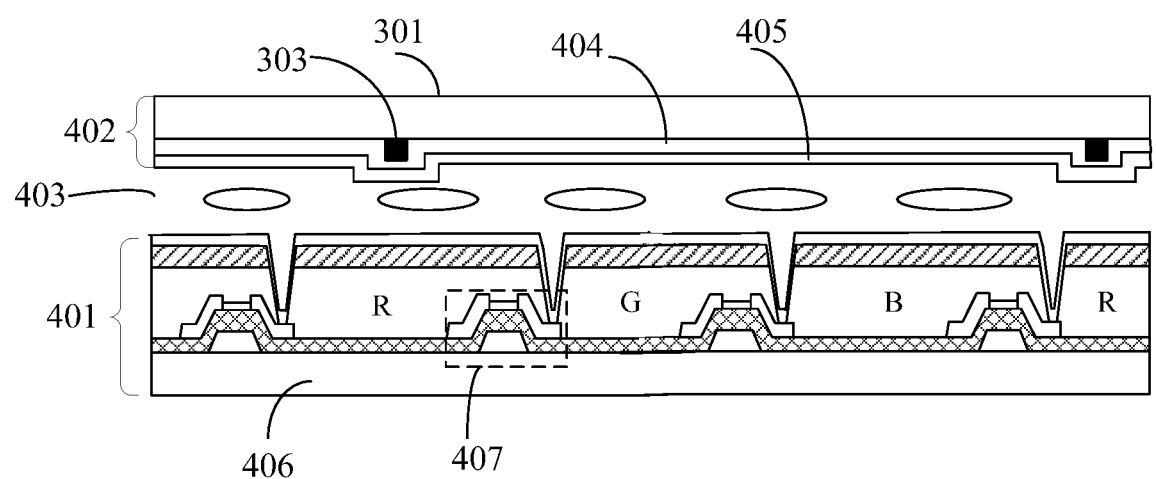
FIG. 4 illustrates a schematic sectional view of the curved display panel according to an embodiment of the present disclosure.

An embodiment of the present disclosure further provides a curved display panel. FIG. 4 illustrates a schematic sectional view of the curved display panel according to an embodiment of the present disclosure. It is to be noted that FIG. 4 merely schematically illustrates a relative positions relationship among various components of the curved display panel, and for simplicity, in FIG. 4 the curved display panel is drawn to be a plane. In the actual product, both the array substrate and the substrate (also referred to as the counter substrate herein) arranged opposite to the array substrate are bent to have a certain radian.

As shown in FIG. 4, the curved display panel may include an array substrate 401, a counter substrate 402 arranged opposite to the array substrate 401, and a liquid crystal layer 403 arranged between the array substrate 401 and the counter substrate 402.

In this embodiment, the counter substrate 402 may adopt the substrate in embodiments as shown in FIGS. 3a to 3d. Therefore, the explanation to the substrate in embodiments as shown in FIGS. 3a to 3d herein is also applicable to this embodiment.

As shown in FIG. 4, the counter substrate 402 may include a first base substrate 301 which is curved; a strip-shaped black matrix (referring to 302 in FIGS. 3a to 3d) positioned on the first base substrate 301 and extending along a direction substantially parallel to a curved edge of the first base substrate 301; and a blocking portion 303 positioned on the first base substrate 301. An orthographic projection of the blocking portion 303 on the first base substrate 301 is within an orthographic projection region of the opening area 304 of the curved display panel on the first base substrate 301. The blocking portion 303 may provide an obstacle in an extension direction (i.e., on the potential movement path of air bubbles, as shown by the arrows in FIGS. 3a to 3d) of the strip-shaped black matrix, which may prevent movement and convergence of the air bubbles in the liquid crystal.

Moreover, it should be understood that in embodiments of the present disclosure, the counter substrate 402 may further include an over coat (OC) 404 and a common electrode layer 405 positioned on the strip-shaped black matrix.

In the process of fabricating the counter substrate 402, a black color resist layer may be formed on the first base substrate 301, and then the strip-shaped black matrix 302 and the blocking portion 303 may be simultaneously formed by way of one patterning process. The shape of the blocking portion 303 may be selected according to requirements for the specific product. For example, the blocking portion 303 may be a recess or a protrusion on the strip-shaped black matrix 302. Optionally the blocking portion 303 may be a connection part connecting two strip-shaped black matrices 302 or an island positioned between two strip-shaped black matrices 302 and isolated from the strip-shaped black matrices. Next, the common electrode ITO layer 405 and a spacer layer or the like may be successively formed.

Figure 5A:
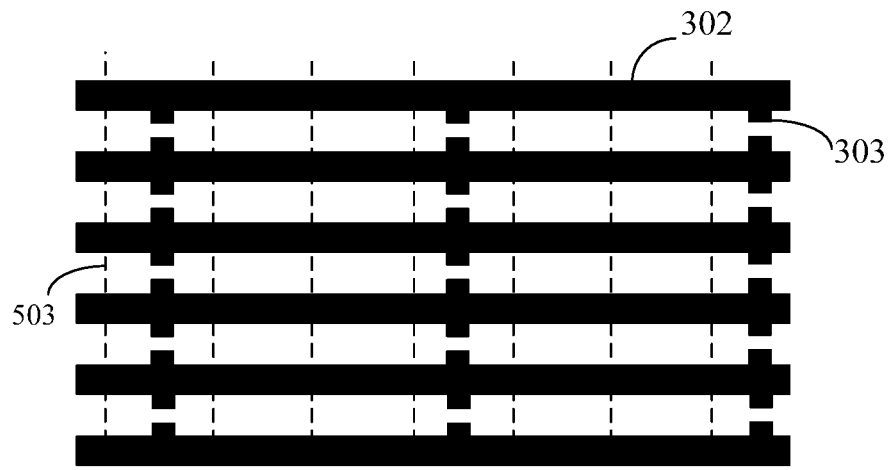
FIG. 5a illustrates a schematic diagram of a position relationship between a strip-shaped black matrix and a blocking portion on the substrate according to an embodiment of the present disclosure.
Figure 5B:
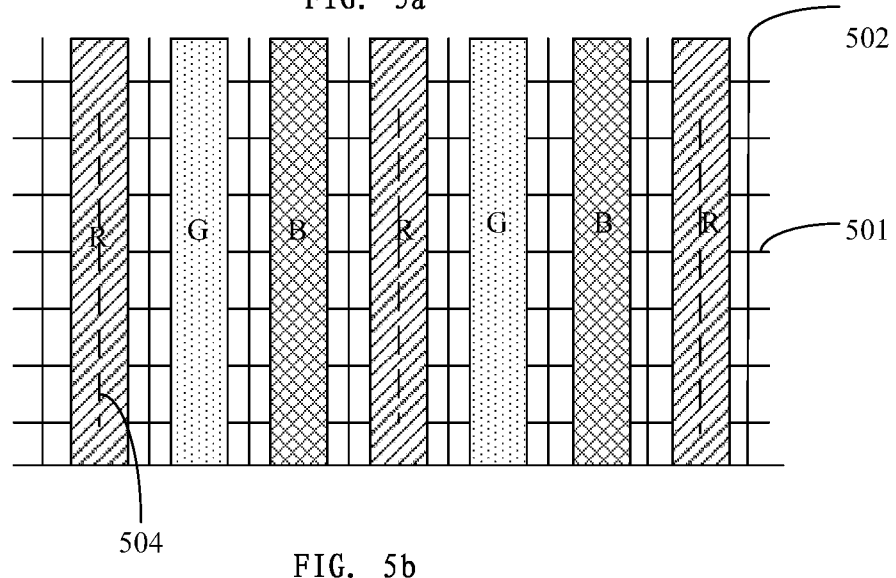
FIG. 5b illustrates a schematic diagram of a position relationship among a color filter region (or sub-pixel region), a gate signal line and a data signal line on the array substrate according to an embodiment of the present disclosure.

The array substrate 401 may include a second base substrate 406 having a bending direction the same as that of the first base substrate 301; a thin film transistor 407 positioned on the second base substrate 406; and a first signal line (such as a gate signal line) 501 and a second signal line (such as a data signal line) 502 (as shown in FIG. 5b) intersecting with each other and positioned on the second base substrate 406. An orthographic projection of the first signal line (such as the gate signal line) 501 (in the row direction, as shown in FIG. 5b) on the first base substrate 301 is within an orthographic projection region of the strip-shaped black matrix 302 (as shown in FIG. 5a) on the first base substrate 301. That is, the position of the first signal line 501 on the second base substrate 406 is corresponding to, in a direction perpendicular to the first base substrate and the second base substrate, that of the strip-shaped black matrix 302 on the first base substrate 301. Correspondingly, the orthographic projection of the second signal line 502 on the first base substrate 301 is between the orthographic projections of two adjacent two columns of opening areas 304 on the first base substrate 301.

By this configuration, different rows of pixels may be spaced by the strip-shaped black matrix 302, and different columns of pixels may be spaced by, for example, the data signal line. It is to be understood that in one or more embodiments, positions of the gate signal line (first signal line) 501 and the data signal line (second signal line) 502 also may be interchangeable, such that the position of the data signal line 502 is corresponding to the position of the strip-shaped black matrix 302. It is also to be understood that, according to the actual requirements for the product, the position of the strip-shaped black matrix 302 also may be corresponding to positions of other signal lines (if present) excluding the gate signal line 501 and the data signal line 502.

The array substrate 402 may further include a color filter layer positioned on the second base substrate 406. A via to a source or a drain of the thin film transistor is formed in the color filter layer.

In an embodiment, the color filter layer may include a red filter region, a green filter region and a blue filter region. It should be understood that the red filter region, the green filter region and the blue filter region respectively correspond to the red sub-pixel (R), the green sub-pixel (G) and the blue sub-pixel (B) of the curved display panel. In this embodiment, the orthographic projection of the blocking portion 303 on the first base substrate 301 is within the orthographic projection region of one of the red filter region, the green filter region and the blue filter region on the first base substrate 301. In an alternative embodiment, the orthographic projection of the blocking portion 303 on the first base substrate 301 is within the orthographic projection region of the red filter region on the first base substrate 301. That is, the blocking portion 303 is at the position on the first base substrate 301 corresponding to the red filter region. This configuration ensures that the blocking portion 303 does not significantly affect the transmittance of the curved display panel, and may prevent the air bubbles from moving in the liquid crystal layer of the curved display panel, and thus may prevent small air bubbles from converging into large air bubbles.

FIG. 5a illustrates a schematic diagram of a position relationship between the strip-shaped black matrix 302 and the blocking portion 303 on the counter substrate according to an embodiment of the present disclosure; and FIG. 5b illustrates a schematic diagram of a position relationship among the color filter region, the gate signal line 501 and the data signal line 502 on the array substrate according to an embodiment of the present disclosure. The dashed line 503 in FIG. 5a represents the position, on the counter substrate, corresponding to the data signal line 502 on the array substrate in FIG. 5b, and the dashed line 504 in FIG. 5b represents the position, on the array substrate, corresponding to the blocking portion 303 on the counter substrate in FIG. 5a. As shown in FIG. 5a and FIG. 5b, the extension direction of the strip-shaped black matrix 302 is approximately parallel to the gate signal line 501, and the blocking portion 303 is arranged within the color filter region/color sub-pixel RGB (such as the red filter region/red sub-pixel R) region.

In the curved display panel provided by embodiments of the present disclosure, by arranging the blocking portion 303 on the first base substrate 301, the blocking portion 303 provides an obstacle in the direction (e=i.e., on the potential movement path of air bubbles) along which the strip-shaped black matrix 302 extends, which may effectively prevent small air bubbles from converging into large air bubbles in the seal oven process, thereby preventing from having an adverse influence on the display effect of the display panel. Moreover, the blocking portion 303 is within the orthographic projection region of the opening area 304 of the curved display panel on the first base substrate 301 rather than between the orthographic projections of adjacent opening areas 304 on the first base substrate 301, so no problem such as color mixture, color cast or light leak is caused when curving the substrate.

An embodiment of the present disclosure further provides a curved display device, including any one of the curved display panels described herein. The curved display device provided by this embodiment may adopt the curved display panel described herein. Therefore, the explanation to the curved display panel also is applicable to the curved display device in this embodiment, and thus is not repeatedly described in this embodiment.

Likewise, in the curved display device provided by this embodiment, by arranging the blocking portion 303 on the first base substrate 301, the blocking portion 303 is within the orthographic projection region of the opening area 304 of the curved display panel on the first base substrate 301, such that the blocking portion 303 provides an obstacle in the direction (i.e., on the potential movement path of air bubbles) along which the strip-shaped black matrix 302 extends, which may effectively prevent small air bubbles from converging into large air bubbles in the seal oven process, thereby preventing from having an adverse influence on the display effect of the display panel. Moreover, the blocking portion 303 is within the orthographic projection region of the opening area 304 on the first base substrate 301, rather than between the orthographic projections of adjacent opening areas 304 on the first base substrate 301, so no problem such as color mixture, color cast or light leak is caused when curving the substrate.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

What is claimed is:

1. A substrate for a curved display panel including a plurality of opening areas arranged in an array, the substrate comprising:
    a curved first base substrate;
    a strip-shaped black matrix positioned on the first base substrate and extending along a direction substantially parallel to a curved edge of the first base substrate; and
    a blocking portion positioned on the first base substrate, the blocking portion including a recess positioned on a side of the strip-shaped black matrix along an extension direction of the strip-shaped black matrix, wherein an orthographic projection of the blocking portion on the first base substrate is within an orthographic projection region of an opening area on the first base substrate.

2. The substrate according to claim 1, wherein the blocking portion and the strip-shaped black matrix are formed by a same material.

3. The substrate according to claim 1, wherein the opening area comprises a red sub-pixel, a green sub-pixel and a blue sub-pixel, and wherein the orthographic projection of the blocking portion on the first base substrate is within an orthographic projection region of at least one of the red sub-pixel, the green sub-pixel and the blue sub-pixel on the first base substrate.

4. The substrate according to claim 3, wherein the orthographic projection of the blocking portion on the first base substrate is within the orthographic projection region of only the red sub-pixel on the first base substrate.

5. A curved display panel comprising an array substrate, plurality of opening areas arranged in an array, and a substrate arranged opposite to the array substrate, the substrate comprising a curved first base substrate, a strip-shaped black matrix positioned on the first base substrate and extending along a direction substantially parallel to a curved edge of the first base substrate, and a blocking portion positioned on the first base substrate, wherein an orthographic projection of the blocking portion on the first base substrate is only within an orthographic projection region of an opening area on the first base substrate, and the array substrate comprising a second base substrate having a bending direction the same as that of the first base substrate, a thin film transistor positioned on the second base substrate, a first signal line and a second signal line intersecting with each other and positioned on the second base substrate, and a color filter layer positioned on the thin film transistor and the second base substrate, the color filter including a red filter region, a green filter region and a blue filter region, wherein an orthographic projection of one of the first signal line and the second signal line on the first base substrate is within an orthographic projection region of the strip-shaped black matrix on the first substrate, wherein a via to a source or a drain of the thin film transistor is formed in the color filter layer, and wherein the orthographic projection of the blocking portion on the first base substrate is within the orthographic projection region of only the red filter region on the first base substrate.

6. The curved display panel according to claim 5, wherein the first signal line comprises a gate signal line, and the second signal line comprises a data signal line.

7. The curved display panel according to claim 6, wherein an orthographic projection of the gate signal line on the first base substrate is within an orthographic projection region of the strip-shaped black matrix on the first base substrate.

8. A curved display device comprising the curved display panel according to claim 5.

9. The curved display panel according to claim 5, wherein the blocking portion comprises a protrusion positioned on a side of the strip-shaped black matrix along an extension direction of the strip-shaped black matrix.

10. The curved display panel according to claim 5, wherein the blocking portion comprises a recess positioned on a side, of the strip-shaped black matrix, along an extension direction of the strip-shaped black matrix.

11. The curved display panel according to claim 5, wherein the blocking portion comprises a connection part connecting two adjacent strip-shaped black matrices.

12. The curved display panel according to claim 5, wherein the blocking portion comprises an island positioned between adjacent strip-shaped black matrices and isolated from the strip-shaped black matrices.

* * * * *